United States Patent

Carpelan

[19]

[11] Patent Number: 6,005,444
[45] Date of Patent: Dec. 21, 1999

[54] CIRCUITS FOR PRODUCING CONTROL CURRENTS FOR A CURRENT CONTROLLED OSCILLATOR

[75] Inventor: Paulus Carpelan, Helsinki, Finland

[73] Assignee: Nokia Telecommunications OY, Finland

[21] Appl. No.: 09/275,340

[22] Filed: Mar. 24, 1999

Related U.S. Application Data

[63] Continuation of application No. PCT/FI97/00574, Sep. 24, 1997.

[30] Foreign Application Priority Data

Sep. 25, 1996 [FI] Finland ................................. 963835

[51] Int. Cl.$^6$ .............................. H03B 5/02; H03L 7/099
[52] U.S. Cl. ................................ 331/16; 331/17; 331/34; 331/177 R
[58] Field of Search .................. 331/16, 17, 34, 331/57, 177 R

[56] References Cited

U.S. PATENT DOCUMENTS

| | | | |
|---|---|---|---|
| 4,494,080 | 1/1985 | Call | 331/17 |
| 5,056,118 | 10/1991 | Sun | 375/106 |
| 5,142,249 | 8/1992 | Hirotomi | 331/57 |
| 5,459,653 | 10/1995 | Seto et al. | 363/73 |
| 5,495,512 | 2/1996 | Kovacs et al. | 375/376 |
| 5,504,459 | 4/1996 | Gersbach et al. | 331/17 |
| 5,604,465 | 2/1997 | Farabaugh | 331/10 |
| 5,604,926 | 2/1997 | Pace et al. | 455/260 |

FOREIGN PATENT DOCUMENTS

0 495 573    7/1992    European Pat. Off. .

*Primary Examiner*—Siegfried H. Grimm
*Attorney, Agent, or Firm*—Merchant & Gould PC

[57] ABSTRACT

In a phase locked loop, a voltage controlled oscillator VCO is formed in a way known as such from a current controlled oscillator CCO (21), the actual control current (ICNTRL) of which is formed by a voltage-to-current amplifier (22). The input voltage of this amplifier is the loop filter's output voltage and it converts the output voltage into the oscillator's control current. When setting the oscillator at a desired medium frequency, the procedure according to the invention is such that a separate setting circuit is used for generating a basic current (IDA), which is led as control current to the oscillator (21) input. The magnitude of the basic current may be controlled in steps. When the desired oscillator frequency has been formed, the current supplied by the setting circuit is frozen at this value and the loop filter voltage is connected to affect the voltage-to-current amplifier, whereby the phase-locked loop will close.

9 Claims, 2 Drawing Sheets

CIRCUITS FOR PRODUCING CONTROL CURRENTS FOR A CURRENT CONTROLLED OSCILLATOR

This application is a continuation of international application number PCT/FI97/00574, filed Sep. 24, 1997.

FIELD OF THE INVENTION

This invention concerns oscillators used in phase-locked loops and in particular a method and a connection for controlling such an oscillator.

BACKGROUND OF THE INVENTION

In the field of communications there is a constant need for phase-locked loops (PLL) having different medium frequencies and bandwidths. In transmission networks, for example, the last data transmission functions are performed on network terminating units. The twin cable, which is several kilometers long and through which the network terminating unit transmits data to and receives data from the network, impairs the received signal. Since the network terminating unit takes its timing from the incoming signal, that is, it is synchronized and locked to the phase of the incoming data flow, a distorted incoming signal makes great demands on the clock signal regeneration block in the data receiver of the network terminating unit. The clock signal is more usually generated in a phase lock circuit, which generates a clock signal locked to a reference signal. On this principle, the data flow from the network functions as a reference signal. The phase lock circuit must be as immune as possible to any phase noise from the network, and any phase noise produced by itself must be as low as possible.

In its basic configuration the phase lock contains basic blocks according to FIG. 1: a voltage controlled oscillator VCO, a phase comparator and a low pass filter. A signal at reference frequency is brought to the first input of the phase comparator while the feedback oscillator output signal, which is also the output signal of the circuit, is brought to the second input. In several applications, such as frequency synthesizers, the feedback branch contains a loop divider with a division number which can be changed in a programmed fashion. Hereby the output signal frequency is divided before taking it to the phase comparator, whereby it is possible to form frequencies that are higher than the reference frequency but which are locked to this. The phase comparator detects the phase difference between the input signals and gives an output signal which is proportional to the phase difference and which is led to a low pass filter working as a loop filter. Its output voltage again is the control voltage of the voltage controlled oscillator. When the loop is balanced, the phase of the output-frequency signal is locked to the phase of the reference-frequency signal.

The phase lock must be such that, firstly, it preserves its balanced state and the output signal is not modulated despite any rapid variation, such as phase noise, contained in either input signal, and such that, secondly, the setting time is as short as possible when the output frequency is changed. Thus, great demands are made on the loop filter, even conflicting ones. When the loop is locked, the filter must have a low cut-off frequency, so that the output signal noise is seen as modulation in the output, while during setting, when the output frequency changes, the loop must have a high cut-off frequency for the setting time to be short. If the cut-off frequency of the loop filter can be changed by controlling, then the lock detector shown in FIG. 1 can be used for forming this control.

Several different connections may be used as oscillators proper. They may be directly voltage controlled or a current controlled connection with a voltage-to-current transducer in front very often forms the core. Suitable current controlled oscillators for use in a phase lock are, for example, ring oscillators, which are formed by connecting an odd number of either single-pole or differential inverters in a sequence, and a current controlled balanced relaxation oscillator. The latter in particular has a low gain and a narrow stable state band. These oscillators are current controlled and therefore a voltage-to-current transducer is required in front of them to convert the voltage from the loop filter into a control current.

Great demands are made on the voltage controlled oscillator in the PLL circuit of the network terminating unit. It must be a) phase stable and have a low noise, b) the adjustment range must be wide and the gain high in a state of change, c) the gain should be low in a stable state, and d) the output frequency should be linearly dependent on the control voltage.

The costs of manufacture and assembly must also be low, and this is indeed a factor which limits the oscillator's complexity from an industrial aspect. These demands are partly conflicting: if the oscillator connection has a high gain, a wide adjustment range is achieved, but at the expense of noise, and correspondingly a low gain will produce a narrow adjustment range only. In a state of change a high gain is required for the locking to take place quickly, but in a balanced state a high gain will cause disturbing phase noise. A low gain improves phase stability and reduces any noise caused by a reference-frequency signal which has passed through the filter. So far no such oscillator has been presented which would meet all these requirements.

It is true that numerous phase lock circuits are available commercially, but most of these are dimensioned for a special application, such as radio and telecommunication etc., and thus for a certain band width. There is no such general purpose phase lock available which would be able to operate on a very wide band but which would still meet strict phase noise and band width requirements which are necessary in various fixed network applications.

Patent application EP-0495573, applicant National Semiconductor Corporation, USA, presents a ring oscillator connection made in a Complementary-Metal-Oxide-Semiconductor (CMOS) process. Since process variations in the microcircuit production bring about variations in the characteristics of P- and N-channels of transistors, the application suggests the use of a special compensating connection, which makes a voltage-to-current transducer give a very small compensating increase or reduction to the current before it is taken to work as control current for the oscillator. An increase or reduction produced by the compensating connection implemented with FET transistors maintains a frequency control range which is standard despite process variations, such as transistor threshold voltages, transconductance and source/drain capacitance. It also compensates for external variations, such as variations in temperature and in operating voltage.

Although this known connection does affect the output current of the voltage-to-current transducer before it is taken to work as the oscillator control current, it can not be used for implementing a general purpose voltage controlled oscillator with a frequency that may be chosen from a wide range, for example, from a range of 50 MHz . . . 150 MHz. To produce such a range the transducer output current ought to vary in a range of several milliamperes, while a loop filter output voltage varies within a typical range of 1.5 ... 3.5 V. This would demand an enormous current gain from the transducer, which would result in an intolerable noise at the oscillator output.

The invention aims at a method of controlling a voltage controlled oscillator VCO intended for a phase lock circuit and at a control connection allowing the selection from a wide frequency range of a desired frequency as the oscillator's medium frequency while the frequency band in a stable state is still narrow and allowing in all conditions a low noise in the oscillator output signal despite the wide frequency range.

BRIEF SUMMARY OF THE INVENTION

The voltage controlled oscillator VCO is formed in a manner known as such from a current controlled oscillator CCO, the actual control current of which is formed with a voltage-to-current amplifier. The input voltage of this amplifier is the output voltage of the loop filter and it converts the output voltage into an oscillator control current.

When setting the oscillator at the desired medium frequency the procedure is such that the output current of the voltage-to-current amplifier is first set at zero. This is done by setting the input voltage of the voltage-to-current amplifier equal to the voltage supplied by the loop filter when at the mid-point of its variation range. The amplifier output current is hereby zero. The real output voltage of the loop filter is prevented from influencing the input of the voltage-to-current amplifier. Using a separate setting circuit, a basic current is then generated, which is led as control current to the oscillator input, which in response to the basic current will vibrate at a frequency corresponding to the current in accordance with the frequency/control circuit characteristic of the oscillator in question. The magnitude of the basic current generated by the setting circuit may be controlled from a minimum value to a maximum value with steps of equal intervals, so that a certain oscillator medium frequency corresponds to each current value.

When the desired oscillator frequency has been formed, the current supplied by the setting circuit is frozen at this value and the voltage-to-current amplifier is again connected to the oscillator input, whereby the phase-locked loop will close. If the input signal frequency is different from the medium frequency formed with the setting circuit, then the voltage-to-current amplifier will supply a small correction current, so that the oscillator is locked to the input signal. A sum of the voltage-to-current amplifier current and the basic current generated by the setting circuit thus affects the oscillator input. The result is that the voltage variation of the loop filter output signal, that is, the voltage-to-current amplifier input signal, between the top and bottom limits of its variation range is reflected only as a small current variation at the voltage-to-current amplifier output, because the setting circuit produces the actual basic current corresponding to the medium frequency. For this reason, the gain of the voltage-to-current amplifier may be quite small, which improves the noise generated by the phase-locked loop.

The matter may be considered in such a way that while the phase-locked loop is locked, the voltage-to-current amplifier produces a correction current only, which is very low, and the much higher output current of the setting circuit is the oscillator control current proper. A change from the locked state to either side will produce at the voltage-to-current amplifier output a small positive or negative change in the output current, depending on the direction of the change. The output current added to or deducted from the output current produced by the setting circuit will produce a sum current, which speeds up or slows down the vibration frequency of the oscillator, so that the loop will lock again.

According to an advantageous embodiment, the setting circuit is a DA converter operating in the current mode which in response to a digital control word brought to the setting circuit will produce a current value which corresponds to the control word and brings the oscillator to the desired frequency. By changing the control word a number of discrete current values can be produced. Their difference or current step is standard, whereby when the current value is changed the oscillator medium frequency will change almost linearly with discrete steps. Thus, a medium frequency suitable for a certain application can always be found.

An advantage of digital control is that it can utilize the entire frequency range of a wideband voltage controlled oscillator and select any desired medium frequency. When choosing a sufficiently dense resolution, that is, bit number and current step, for the DA converter, the gain of the voltage-to-current amplifier may be reduced to the level required by the application.

LIST OF FIGURES

The invention is described in greater detail by referring to the appended diagrammatic figures, wherein FIG. 1 shows the phase lock principle;

DESCRIPTION OF AN ADVANTAGEOUS EMBODIMENT

Figure 1:
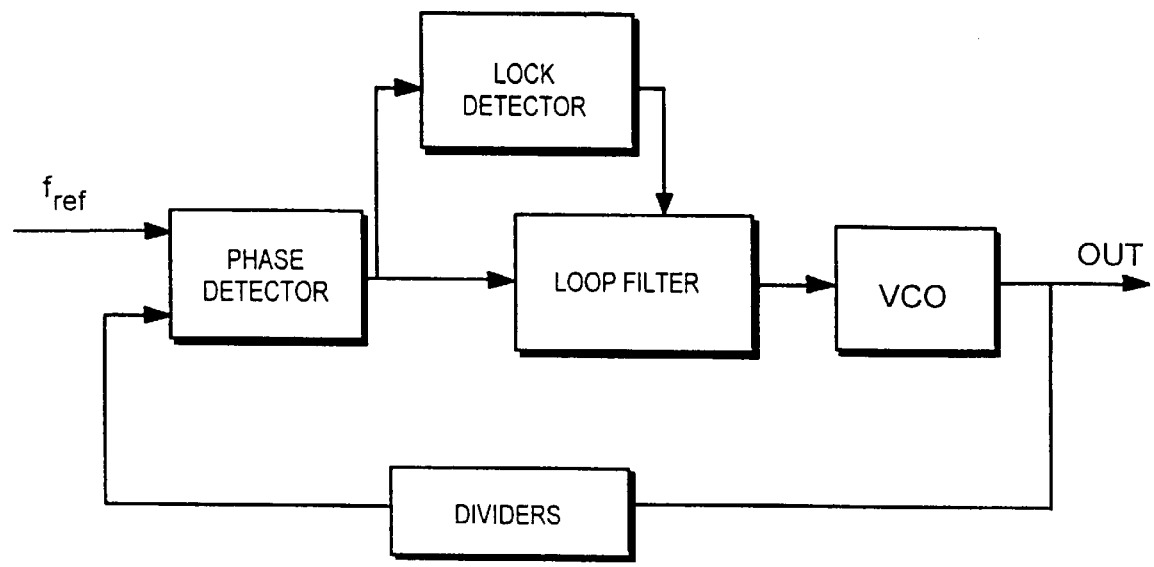
Figure 2:
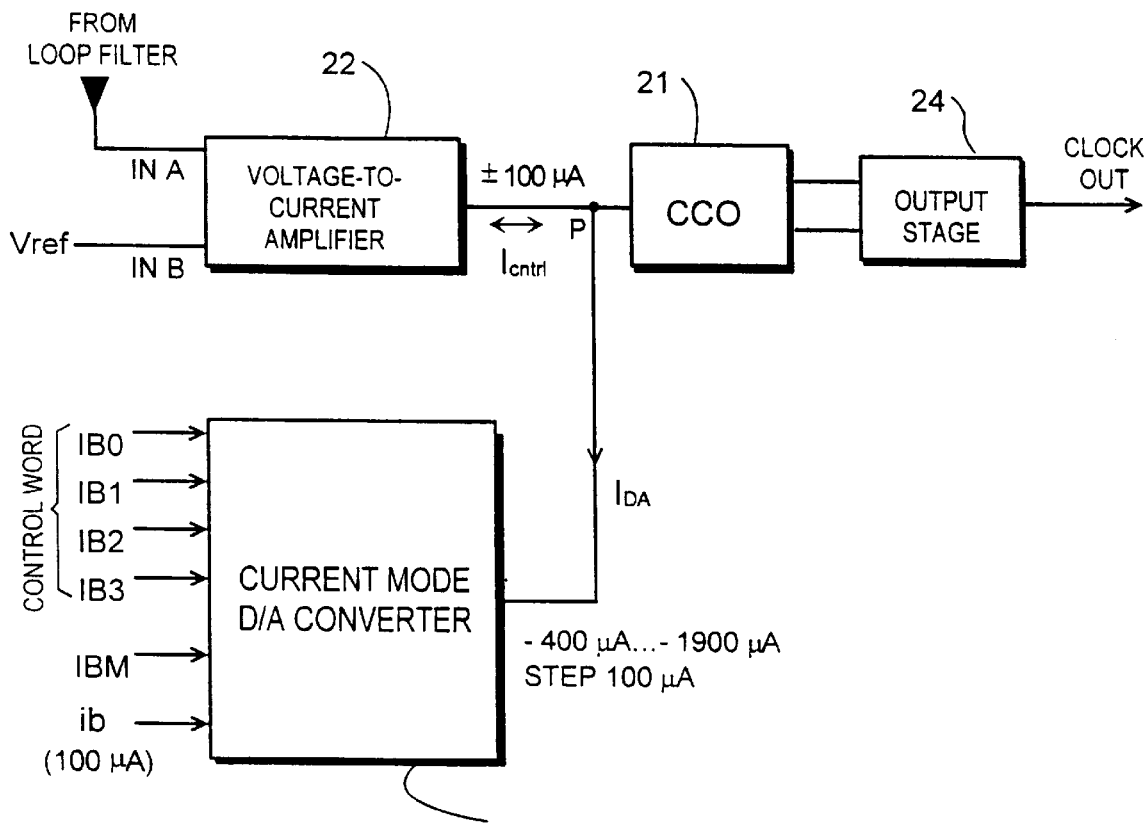
FIG. 2 shows the structure of the VCO according to the invention.

The connection in its entirety shown in FIG. 2 is a voltage controlled oscillator VCO and it is intended for use, for example, in a phase locked loop according to FIG. 1. Such phase-locked loops are used in network terminating units in particular. In the connection of FIG. 2, the linear output voltage produced by the loop filter (FIG. 1), which has a certain variation range, is led to the input of voltage-to-current amplifier 22 which has a low gain. Amplifier 22 converts the input voltage into a proportional linear output current ICNTRL, which is led further to the control current input of current controlled oscillator 21. The oscillator for its part produces an output frequency (clock out) proportional to the current control. If the oscillator output signal is differential and not suitable for use with digital systems according to standard logic, due to incompatibility of voltage levels, an output stage 24 must be used in addition. This is a comparator circuit converting the oscillator 21 output signal levels into standard levels.

The basic connection elements so far presented and connected are VCO implementation modes which are known as such. In order to bring about a wide oscillator frequency range, a voltage-to-current amplifier with high gain ought to be used, whereby too high a noise would result. In order to bring about low noise but still a very wide frequency range, a setting circuit 23, which is a DA converter operating in current mode, is added to the connection in accordance with the invention.

The DA converter input is a digital control word, which is converted by the converter into a corresponding current value IDA, and this current is summed at point P into the output current ICNTRL of the voltage-to-current amplifier 22. The control word may be supplied, for example, by a digital signal processor DSP or other controller (not shown in the figure) located in the network terminal. In FIG. 2, the control word 4 is a 4-bit binary word and it is brought to parallel input IB0, IB1, IB2 and IB3. 16 levels can be formed with four bits. The sixth input ib is the input of a reference current generated in a separate bias current source. By multiplying and summing this current in the way told by the binary word output, 16 current levels are formed in the converter. The smallest current step is equal to the reference current, which is set as 100 $\mu$A in this example.

With bit IBM the bottom limit, which is called the base current, is defined for the converter output current IDA. The oscillator requires a certain minimum current to operate properly and a current corresponding to bit 1 M is set as this base current. The bit is set permanently at the value=1 and in this example the bit weight of the value of the smallest current produced by the converter is 400 $\mu$A. Through these arrangements and with the 4-bit control word any current from the set of currents −400 $\mu$A, −500 $\mu$A, . . . , −1900 $\mu$A may thus be chosen as basic current, that is, as the output current IDA of the converter. Any one of these output currents when taken to the control input of current controlled oscillator 21 makes the oscillator vibrate at a medium frequency corresponding to this current. Depending on the oscillator type, the current may be positive or, as in this example, negative.

The voltage-to-current amplifier 22 may be of any known type. It is advantageous to use a known cascade-connected push-pull output stage differential amplifier topology. Such an amplifier is known under the name of Operational Transconductance Amplifier (OTA). Its cascade-connected output stage transistors increase the output resistance and thus improve the amplifier's ability to supply current. Since the input is differential, the inputs in FIG. 2 are shown with the marks INA and INB respectively. Should an OTA amplifier be used with single polarity, the output voltage given by the loop filter is led to the INA input, while such a standard voltage is connected to the INB input, which is at the mid-point of the range of variation of the loop filter output voltage. When the variation range of the voltage controlled oscillator is, for example, 1.5 V . . . 3.5 V, a voltage of 2.5 V is thus set at input INB. Hereby, when the loop is locked, the loop filter output voltage is close to a value of 2.5 V corresponding to the output frequency, which depending on the loop input frequency may be slightly to one side of the medium frequency set with the setting circuit, and when aiming at a balanced state the loop filter output voltage will differ from the mentioned value close to 2.5 V the more the bigger the difference of the oscillator frequency is from the reference frequency.

The operation of the connection according to the invention is described referring to FIG. 2. When setting oscillator 21 at the desired frequency, the voltage at input INA of the voltage-to-current amplifier 22 is set at the mid-point of its range of variation, that is, at a value of 2.5 V. Since the same voltage is at input INB of the voltage-to-current amplifier, the output voltage of voltage-to-current amplifier 22 will not affect the oscillator input. The DA converter is then given some 4-bit control word, in response to which the converter produces a basic current IDA corresponding to the word which is led as control current to the input of oscillator 21. In response to this basic current, the oscillator will vibrate at a frequency corresponding to the current in accordance with a frequency/control current characteristic which is typical of the oscillator in question.

Then the loop filter output voltage is allowed to affect input INA of voltage-to-current amplifier 22, whereby the phase-locked loop will close. Thereafter the sum of current ICNTRL of voltage-to-current amplifier 22 and the basic current IDA generated by DA converter 23 will thus affect the oscillator input. Since the loop filter output voltage is set at the mid-point of its range of variation, the loop will promptly adopt its final state of balance. The voltage variation of the filter output voltage and of the signal affecting input INA of the voltage-to-current amplifier 22 between the top and bottom limits of its range of variation is reflected only as minor current variations at the voltage-to-current amplifier output. Thus, the gain of voltage-to-current amplifier 22 is very low, which will improve the noise caused by the phase-locked loop in the loop output signal.

When electric power is turned on in the phase-locked loop, no voltage will at first be obtained from the loop filter. Even if no control word is given at once from DA converter 23, it immediately supplies a base current of 400 $\mu$A, for the reason that bit IBM is permanently at a value of 1, so oscillator CCO 21 starts vibrating at once at a frequency corresponding to the base current.

It has been explained above that the effect of control produced by voltage-to-current amplifier 22 is eliminated by setting INA equal to INB. It has emerged in practice that this is not necessary. The loop may be closed at all times and when the desired medium frequency has been set, the loop will lock on its own, if this is at all possible. In such a case it is preferable to use a loop filter the band width of which can be controlled. This is not necessary, should a change in the DA converter's output correspond to a sufficiently short frequency step in the oscillator's output frequency.

Figure 3:
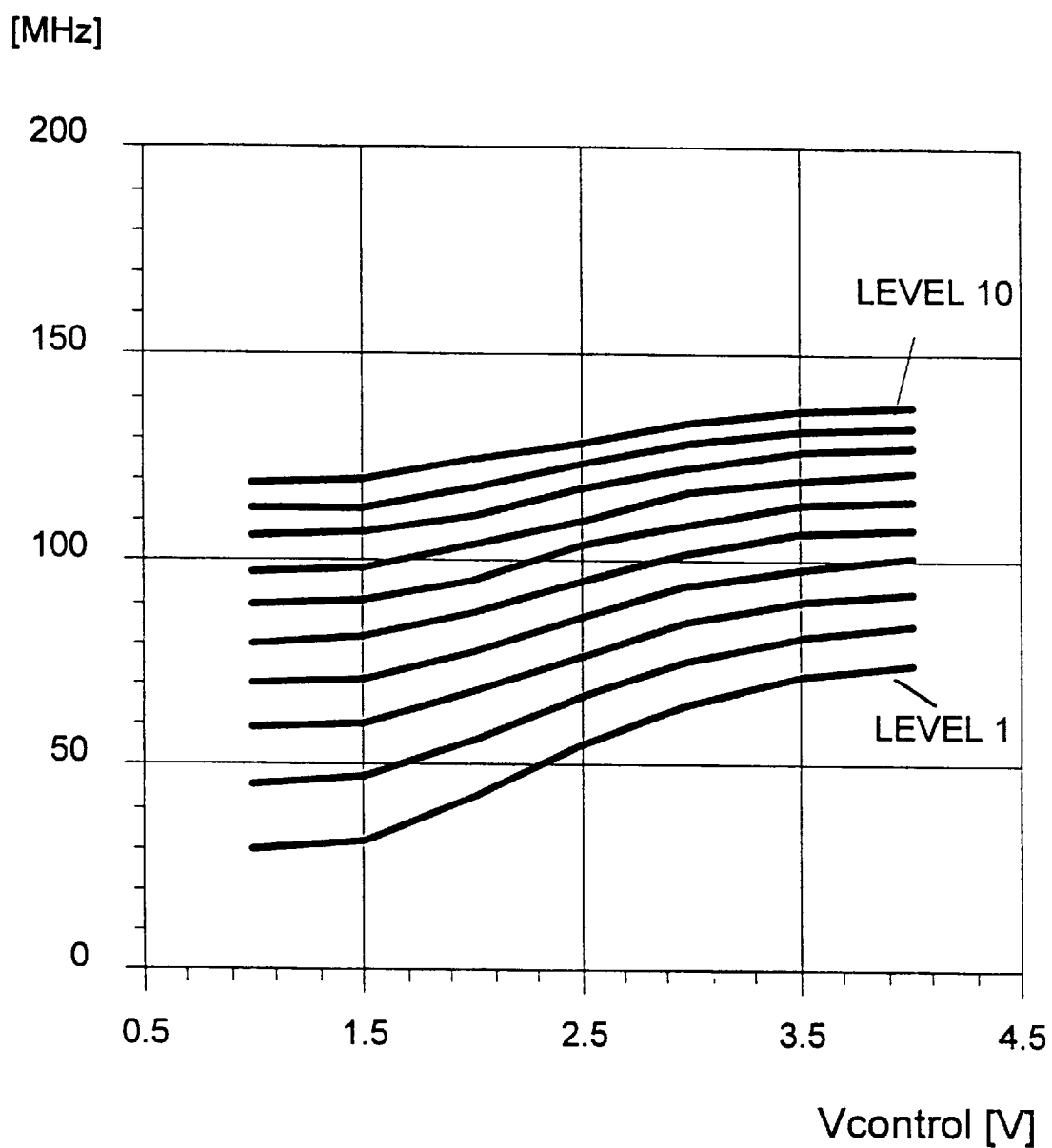
FIG. 3 shows the oscillator output frequency as a function of the control voltage with setting circuit current levels as parameters.

Referring to the curves in FIG. 3, the operation of the connection will also be clarified. The figure shows in the form of curves how the setting circuit affects the oscillator output frequency. Current levels, here levels 1–10 only, supplied by the DA converter are the parameter in the figure. At level 1 the medium frequency produced by the phase-locked loop is approximately 55 MHz (the control voltage is 2.5 V) and by changing the control voltage from one limit to the other the frequency varies approximately within a range of 30–75 MHz. When it is desired that the same phase-locked loop produce a slightly higher frequency, the DA converter is given a new control word, which will produce a current corresponding, for example, to level 2. The medium frequency of the oscillator will now rise to approximately 67 MHz and the frequency range is approximately 47–84 MHz. Thus, frequency ranges which are at a distance of one current step are overlapping. If it is desirable that the same phase-locked loop produce an even higher frequency, the DA converter is again given a new control word, which will produce, for example, a current corresponding to level 10. The medium frequency of the oscillator now rises to approximately 133 MHz.

It is advantageous in a connection according to the invention that the range of variation of the voltage-to-current amplifier output current is larger than the current step of the AD converter. It is required that the range of variation of the voltage-to-current amplifier output current be about twice the current step of the converter. According to FIG. 3, the frequency curve of the following level will hereby begin before the preceding frequency curve ends, so that succeeding frequency ranges will be partly overlapping. In this way, when all output current levels of the DA converter are used, all frequencies between the maximum frequency and the minimum frequency may be covered without any gap.

It is an advantage of the presented digital control that it may utilize the entire frequency range of a wideband voltage controlled oscillator and any desired medium frequency may be chosen. When choosing a sufficiently dense resolution for the DA converter, the gain of the voltage-to-current amplifier may be reduced to a level required by the application, whereby the noise will be low in the loop output frequency.

I claim:

1. Method of locking the output frequency of a voltage controlled oscillator to a reference frequency in a connection comprising a voltage-to-current amplifier (22) for converting a control voltage into a control current (ICNTRL) and a wideband current controlled oscillator (21) which in response to the control current (ICNTRL) led to the control input generates an output-frequency signal corresponding to the control current, characterized in that the oscillator's control current is formed in two stages so that an external control is applied to a current mode DA converter (23) which in response to said control forms a basic current (IDA), the basic current is brought to the oscillator control input wherein the oscillator output frequency is set corresponding to the basic current (IDA), and the control current (ICNTRL), which is produced by the voltage-to-current amplifier and which corrects the oscillator output frequency's deviation from the reference frequency, is summed to the basic current (IDA).

2. Method as defined in claim 1, characterized in that the external control is a n-bit digital word, whereby the current mode DA converter may form basic currents the number of which is 2n.

3. Method as defined in claim 1, characterized in that the current step between successive basic currents is smaller than the range of variation of the control current (ICNTRL) produced by the voltage-to-current amplifier, whereby successive frequency ranges of the oscillator will be partly overlapping.

4. A connection for locking the output frequency of a voltage controlled oscillator in a phase-locked loop (PLL) to a reference frequency, which connection comprises a voltage-to-current amplifier (22) for converting a control voltage affecting its input into an output control current (ICNTRL), and a wideband current controlled oscillator (21), which is connected to the output of the voltage-to-current amplifier and which in response to the current led to the control input generates an output frequency signal corresponding to the current, characterized in that the connection also comprises:

a current mode DA converter (23) which receives to the input an external control word (IB1, . . . ,1B4) and which may generate in its output several basic currents and in response to the value of the external control (IB1, . . . ,IB4) connects as a basic current (IDA) to the oscillator (21) control input a basic current corresponding to the value, whereby the basic current determines the oscillator's center frequency and the control current (ICNTRL) keeps the oscillator locked to the reference frequency.

5. Connection as defined in claim 4, characterized in that the current step between the basic currents is smaller than the range of variation of the control current (ICNTRL) produced by the voltage-to-current amplifier.

6. Connection as defined in claim 4, characterized in that the control word of the DA converter is a n-bit word, whereby basic currents to a number of 2n can be formed.

7. Connection as defined in claim 4, characterized in that it contains means for preventing the control current (ICNTRL) from being summed to the basic current (IDA) when changing the control word and thus the basic current.

8. Connection as defined in claim 4, characterized in that the voltage-to-current amplifier (22) input is connected to a loop filter output.

9. Method as defined in claim 2, characterized in that the current step between successive basic currents is smaller than the range of variation of the control current (ICNTRL) produced by the voltage-to-current amplifier, whereby successive frequency ranges of the oscillator will be partly overlapping.

* * * * *